(12) United States Patent
Zhang

(10) Patent No.: US 7,028,245 B2
(45) Date of Patent: Apr. 11, 2006

(54) EVEN-LOAD SOFTWARE REED-SOLOMON DECODER

(75) Inventor: Jian Zhang, Irvine, CA (US)

(73) Assignee: Equator Technologies, Inc., Seattle, WA (US)

( * ) Notice: Subject to any disclaimer, the term of this patent is extended or adjusted under 35 U.S.C. 154(b) by 554 days.

(21) Appl. No.: 09/935,166

(22) Filed: Aug. 21, 2001

(65) Prior Publication Data

US 2003/0046637 A1    Mar. 6, 2003

(51) Int. Cl.
*H03M 13/00*    (2006.01)
(52) U.S. Cl. ...................... 714/784; 714/762
(58) Field of Classification Search ........... 714/784, 714/756, 762, 704, 769, 781, 752, 746; 341/94
See application file for complete search history.

(56) References Cited

U.S. PATENT DOCUMENTS

| 4,566,105 A | * | 1/1986 | Oisel et al. ............ 714/756 |
| 4,567,594 A | * | 1/1986 | Deodhar ................ 714/769 |
| 4,649,541 A | * | 3/1987 | Lahmeyer .............. 714/784 |
| 4,677,623 A | * | 6/1987 | Iwasaki et al. ......... 714/762 |
| 4,868,828 A | * | 9/1989 | Shao et al. ............. 714/704 |
| 5,583,499 A | * | 12/1996 | Oh et al. ................ 341/94 |
| 6,511,280 B1 | * | 1/2003 | Sammartino et al. .... 414/784 |

OTHER PUBLICATIONS

Benjamin Arazi, A Commonsense Approach to the Theory of Error Correcting Codes, 1988 Massachusetts Institute of Technology, pp. 137-146 and pp. 193-194.

* cited by examiner

*Primary Examiner*—Albert Decady
*Assistant Examiner*—Dipakkumar Gandhi
(74) *Attorney, Agent, or Firm*—George A. Zafiris; Jeffrey Van Myers; Graybeal Jackson Haley LLP

(57) ABSTRACT

A software implementation of a Reed-Solomon decoder placing a constant load on the processor of a computer. A Berlekamp-Massey Algorithm is used to calculate the coefficients of the error locator polynomial, a Chien Search is used to determine the roots of the error locator polynomial, and a Forney Algorithm is used to determine the magnitude of the errors in the received digital code word. Each step is divided into m small tasks where m is the number of computational blocks it takes to read in a code word and the processor can pipeline or parallel process one task from each step each time a block is read.

16 Claims, 8 Drawing Sheets

EVEN-LOAD SOFTWARE REED-SOLOMON DECODER

TECHNICAL FIELD OF THE INVENTION

This invention relates generally to burst error-correction codes and more particularly to a software implementation of a Reed-Solomon (RS) code that places a constant load on the processor of a computer.

BACKGROUND OF THE INVENTION

Error-corrective coding is often needed to preserve the integrity of received data. The basic concept is to add redundancy to a message to eliminate the need for retransmission. Shannon's work showed that dramatic gains in performance could be achieved by intelligently adding redundancy to a transmitted message. This addition of redundancy to the message is called Forward Error-Correction (FEC).

There are many methods of adding redundancy, but one of the most efficient and popular methods is RS coding. FIG. 1 is a block diagram of a typical RS system.

The RS encoder takes a block of digital data and adds "redundant" bits (i.e., bits containing some of the same information already present). During transmission or storage of data, data errors may occur for a number of reasons, such as noise, interference, or scratches on a storage medium such as a CD. The RS decoder recovers the original data by processing each received block of data to correct any errors in the received block. The number and type of errors that the decoder can correct depends on the characteristics of the RS code.

Over the last 20 years, RS encoded data has become commonplace in all sorts of communications and computer channels, particularly those that have a potential for bursts of errors, which is where multiple errors tend to be close to each other. RS codes are typically used where the multiple bits in error (an error burst) fall within the frame of a single character and it can be assumed that most of the time only one character is erroneous within a data block.

RS codes are also concatenated with convolutional codes, which are typically used in cases where the transmitted data is a bit stream having an undefined length.

Many practical applications take advantage of the multiple-error-correcting capability of an RS code, including magnetic and optical storage systems, as well as all sorts of communications systems.

Overview of RS Codes

Although the mathematics underlying RS coding is complex, some basic terminology for describing RS codes is provided here. An RS code is described as an (n, k) code, where the code words each consist of n symbols, k of which are message symbols. The following parameters characterize RS codes:

b=the number of bits per symbol
n=the total number of symbols per code word
k=the number of symbols in the unencoded word
(n–k)=the number of check symbols per code word
t=(n–k)/2, the maximum number of erroneous symbols that can be corrected FIG. 2 shows a typical RS code word broken into data and parity parts, which are further broken into symbols, which are further broken into bits. The RS code is a systematic code because the data is left unchanged and the parity symbols are appended to the data.

Designing an RS code is difficult, and knowledge of RS codes is highly specialized, and thus is typically outside the mainstream designers' domain of expertise. Specifically, RS codes operate over an algebraic finite field called a Galois Field (GF), and the encoding and decoding algorithms are complicated. Due to the complexity of the RS coding theory, this document does not discuss in detail all aspects of the RS algorithms, but focuses instead on the implementation of these algorithms. There are a large number of available coding algorithms and techniques for carrying out the finite field arithmetic.

Implemented RS Algorithms

Although there are a large number of RS algorithms to choose from, most of the RS algorithms used today are based on the Galois Field GF(256). However, algorithms based on GF(128), GF(512) and other Galois fields are used. Likewise, there are a multitude of generator polynomials, and primitive elements to choose from, though only a few are commonly used. See *A Commonsense Approach to the Theory of Error Correcting Codes*, pp. 193, 194 in appendix A, by Benjamin Arazi for a formal treatment and definitions and explanations of generator polynomials and primitive elements.

Briefly, every GF(q) has a primitive element $\alpha$ such that every field element except 0 is expressed by some power of $\alpha$ (modulo q). Also, $\alpha^{q-1}=1$. That is, operations in the exponent of $\alpha$ are performed modulo q–1. Further, any polynomial g(x) of degree n, modulo on which the operations of the field GF($2^n$) are performed, is called a generating polynomial of the field.

If, for example, the RS code has symbol size b=8 (one byte or 8 bits per symbol), and the symbols are elements of the Galois Field GF($2^8$)=GF(256), then the maximum code word length will be ($2^8$–1)=255 symbols. Further, an RS code with R=2t parity bytes has a generator function $g(x)=(x-r^0)(x-r^1)\ldots(x-r^{R-1})$, where r is a root of the binary primitive polynomial $x^8+x^4+x^3+x^2+1$.

A popular RS code designation is RS(n=255,k=223) with b=8 bit symbols. Each code word contains 255 code word symbols, which are each one byte long. So 223 symbols are data and 32 symbols are parity. That is, referring to FIG. 2 for this code n=255, k=223, b=8, 2t=32 and t=16. Therefore, this RS code word allows an RS decoder to correct any sixteen erroneous symbols in the code word; that is to correct errors in up to 16 bytes anywhere in the code word.

The amount of processing required to encode and decode RS codes is related to the number 2t of parity symbols per code word. A large t allows errors in a larger number of symbols to be corrected but requires more encoding/decoding processing power. Conversely, a small t allows errors in a fewer number of symbols n to be corrected but requires less encoding/decoding processing power.

RS Encoding Algorithm

Each RS code word consists of k message bytes ($M_{k-1}$, $M_{k-2}$, ..., $M_0$) and R=2t parity bytes ($C_{R-1}$, $C_{R-2}$, ..., $C_0$). The check polynomial $C(x)=C_{R-1}x^{R-1}+C_{R-2}x^{R-2}+\ldots+C_0$ is obtained as the remainder when the message polynomial $M(x)=(M_{k-1}x^{k-1}+M_{k-2}x^{k-2}+\ldots+M_0)*X^R$ is divided by the generator function, g(x).

Referring to FIG. 3, the RS Encoder function takes an array of k data symbols as an input and returns an array of n symbols (an RS code word). For brevity, further details of RS encoding are omitted. See *A Commonsense Approach to the Theory of Error Correcting Codes*, pp. 145, 146 by Benjamin Arazi for more information.

RS Decoding Algorithm

There is more than one algorithm that can be used to decode RS codes. Most common are Euclid's algorithm and the Berlekamp-Massey algorithm. The Berlekamp-Massey algorithm is used by an embodiment of the invention (described below) because it is iterative and less computationally intensive since it doesn't involve polynomial multiplication and division, but only sums.

Referring to FIG. 4, the RS Decoder function takes as its input 1 a received code word of n symbols and returns as an output 7 k decoded data symbols together with a count of the number of symbol errors corrected or a flag indicating that more than t errors were present. An RS decoding algorithm is typically divided into the following steps:

i) Calculation of the power sum symmetric functions 2;
ii) Generating the error locator and error evaluator (magnitude) polynomial 3;
iii) Using a search algorithm to search the polynomial roots 4;
iv) Calculating the error values 5 and correcting the errors 6.

Historically, these steps have been performed in hardware in a serial manner where there is no need to have the time required to perform any given step be related to the time required for any other step.

There are several different ways to accomplish these steps. One is to generate a pipeline in which a separate piece of hardware is dedicated to each of the four steps and operates on one block of data at a time. Thus, the pipeline processes four different data blocks at one time and synchronizes the processing. This is hardware intensive, but it does allow for data to be processed at the rate at which it comes in as long as the time it takes to perform any step is less than the time it takes to input the next block of data. Another is to perform all the steps serially in software for a block of data and when the last step is completed read the next block. This has limited usefulness since the rate of arrival of the next block of data is a function of the transmitter and receiver, not the RS decoding processor. Therefore this process is typically limited to a relatively slow transmission rate.

The Peak-Load Issue

To implement a software RS decoder on a general processor, a block processing technique is typically used to reduce real-time sensitivity of the system.

When the block size is identical with the RS code word size, there is no peak-load issue. In every block, the following tasks need to be performed:

1. Read in a complete RS code word (you can read in a complete RS code word in a block because in this case the block size is exactly equal to code word length);
2. Perform all the steps i)–iv) of the RS decoding algorithm as discussed above one by one.

However, the block size of most systems is limited by system parameters, and therefore, the block size is usually smaller than the RS code length. This is what causes a peak-load issue to arise.

Assume the block size is half of the RS code length, meaning the decoding procedure described needs to be repeated every 2 blocks. It also means that each code word is two blocks in length.

In the first block, since only half of the RS code is available, the decoding procedure cannot be started, and nothing can be done after the read of the first half of the RS code word. Only after reading in the second block is a complete code word available, and then RS decoding can be performed. Since all the calculation is performed after reading in the second block, the processor load associated with the second block is very high, or peaked.

Referring to FIG. 5, where the load is plotted over time, the code word 51 takes two block cycles 50 to be completely read in to the system. No processing can be done during the first two cycles 47 and 48 while the first code word 51 is being read in. In FIG. 5, first letter abbreviations are used for functions. Input is 'I', syndrome is 'S', locator polynomial is 'L', root search is 'R', and error magnitude evaluation is 'M'. During input cycle I2,1 49, which is the first block cycle of the second code word, the syndrome calculation S1 42 is performed on the first code word. During the next block cycle 41, the second half of the second code word I2,2 is read in but no other work is or can be performed. Then, while the first half of the third code word is being read in I3,1, the syndrome calculation S2 46 of the second code word and the error locator polynomial L1 43, of the first code word are calculated. This is followed by block cycle 40 during which no calculation is performed while the system is reading in the second half of the third code word I3,2. A definite peak of load occurs in block cycle 44 when the first half of the fourth code word, I4,1, is read in and at the same time three calculations occur, the root search calculation R1 of the first code word, the error locator polynomial calculation L2 of the second code word, and the syndrome calculation S3 of the third code word. This peak cycle is followed by another cycle when no calculation is performed while the system is reading in the second half of the fourth code word, I4,2. During the following block cycle I5,1, the error magnitude evaluation calculation M1 45 of the first code word occurs during a peak along with all the calculations of block cycle 44 as previously noted. After this there is an alternating no-load cycle followed by a peak-load cycle as long as code words are read in. Therefore, approximately half of the available processing power is unused in this example.

If each code word is longer than two blocks, then the peak problem becomes worse because there are more blocks when nothing can be done but to read more of the code word in.

This means that most of the computation will be performed at those blocks containing the last symbol of an RS code word. The peak-load occurring in these blocks will cause a severely skewed computation load distribution over the whole decoding process, and therefore an obvious performance loss in many systems such as multi-line and multi-tasking systems.

To some systems where the block size is limited by the delay requirement of the receiver, the peak-load problem may become completely intolerable and may cause system collapse.

SUMMARY OF THE INVENTION

In one embodiment of the invention, the RS decoding algorithm is implemented in software such that the processor load remains constant or approximately constant. This is done by choice of the algorithms used to implement the decoding steps and by choosing the RS code word such that its length is an integer multiple of the size of the block used to read input into the computer performing the decoding. The RS code word may be, for example, exactly two, three, or more blocks long, but is not, for example, two and a half blocks long. This embodiment of the invention also takes advantage of pipelining or parallel processing.

DESCRIPTION OF THE INVENTION

Figure 1:
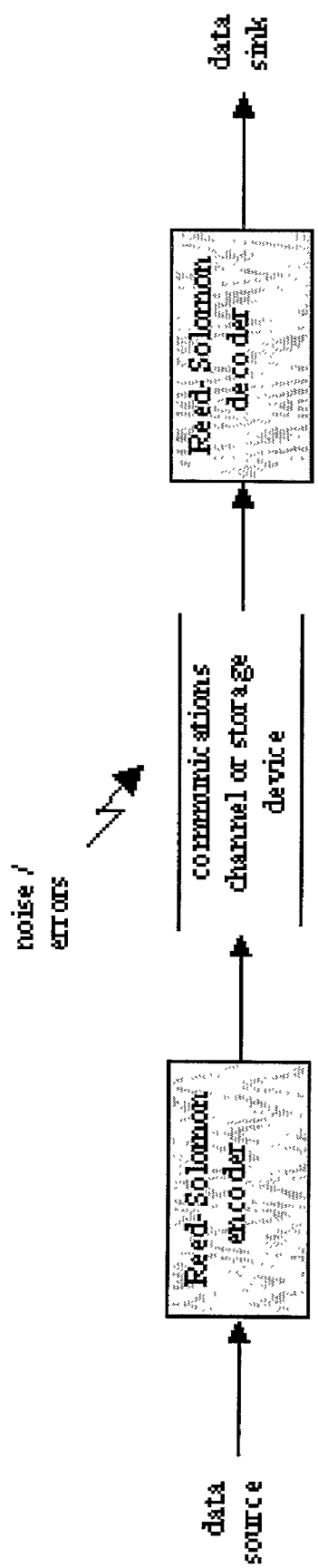
FIG. 1 is a block diagram of a conventional RS System.
Figure 2:
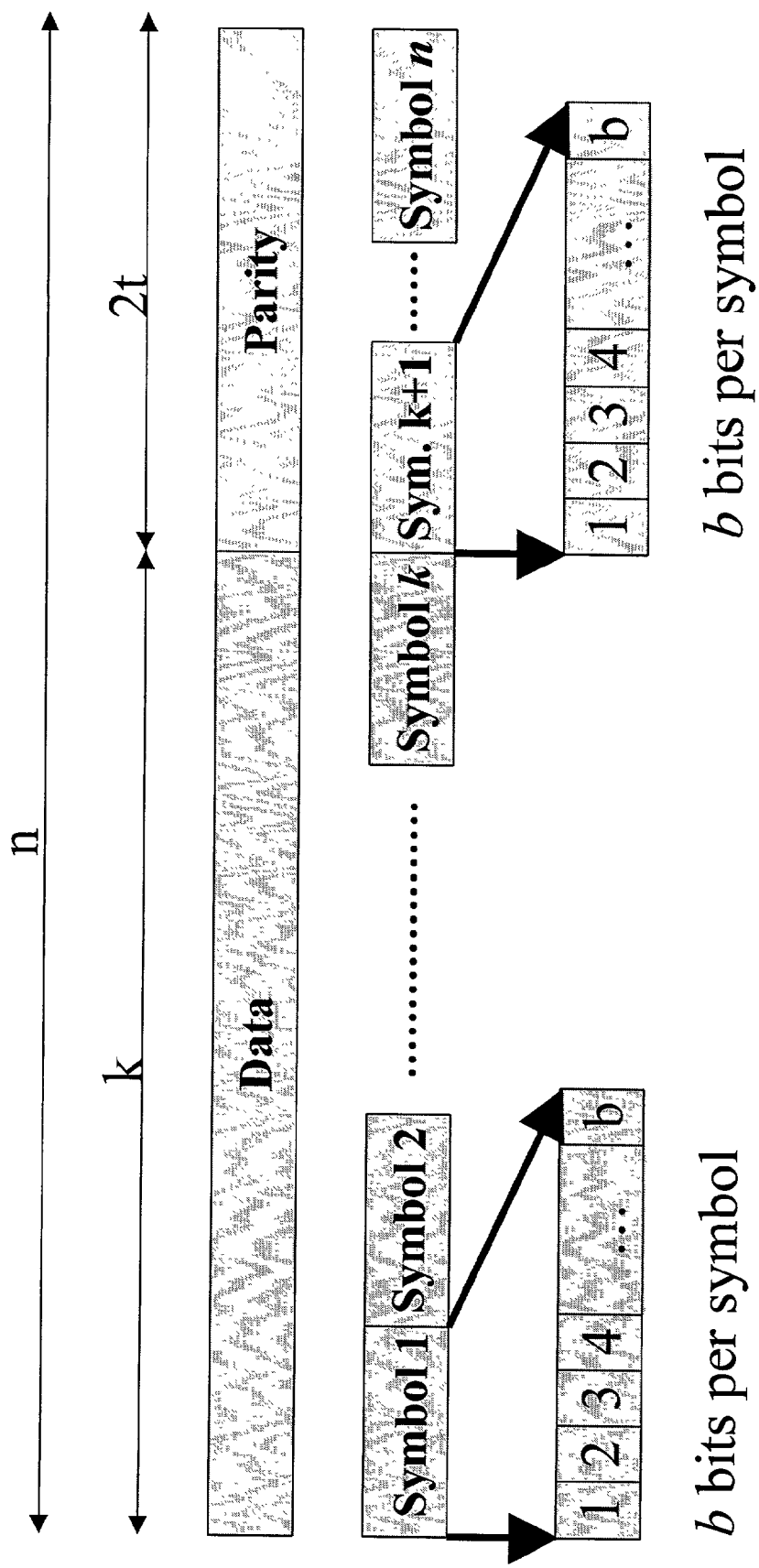
FIG. 2 is a block diagram of a conventional RS code word showing a breakdown into data and parity symbols and a further breakdown into bits.
Figure 3:
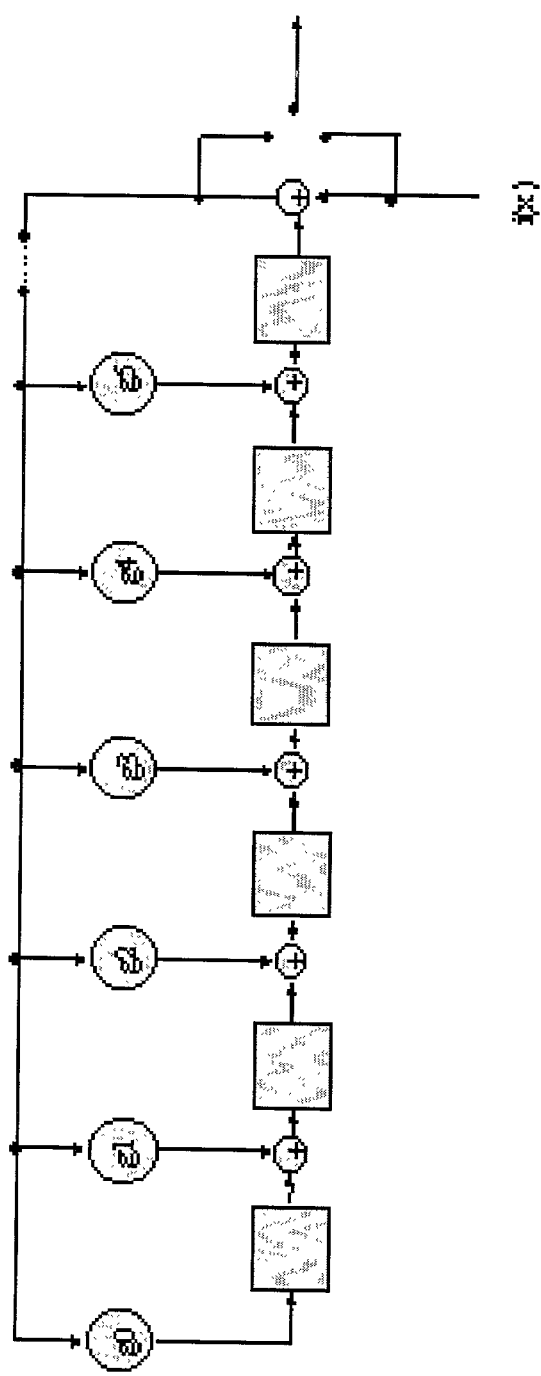
FIG. 3 is a block diagram of a conventional RS Encoder.
Figure 4:
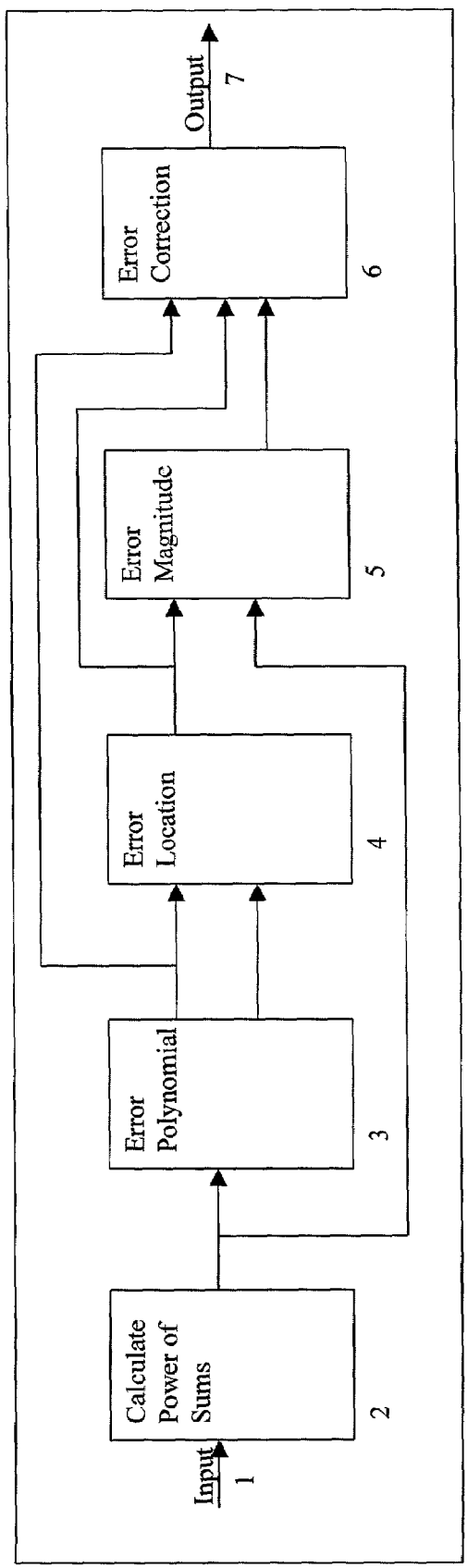
FIG. 4 is a block diagram of a conventional RS Decoder.
Figure 5:
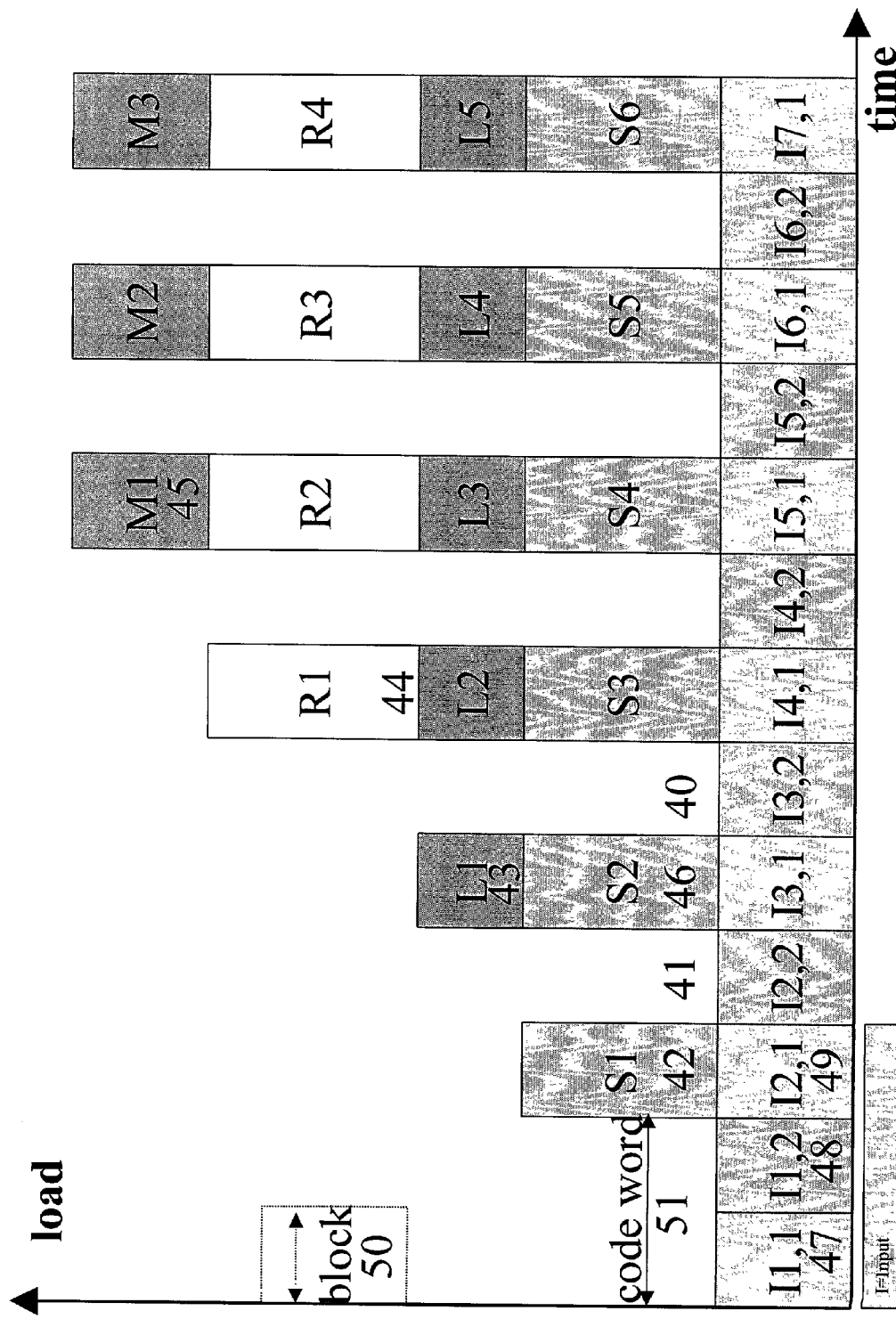
FIG. 5 is a chart illustrating the peak-load problem for a software RS decoder.
Figure 6:
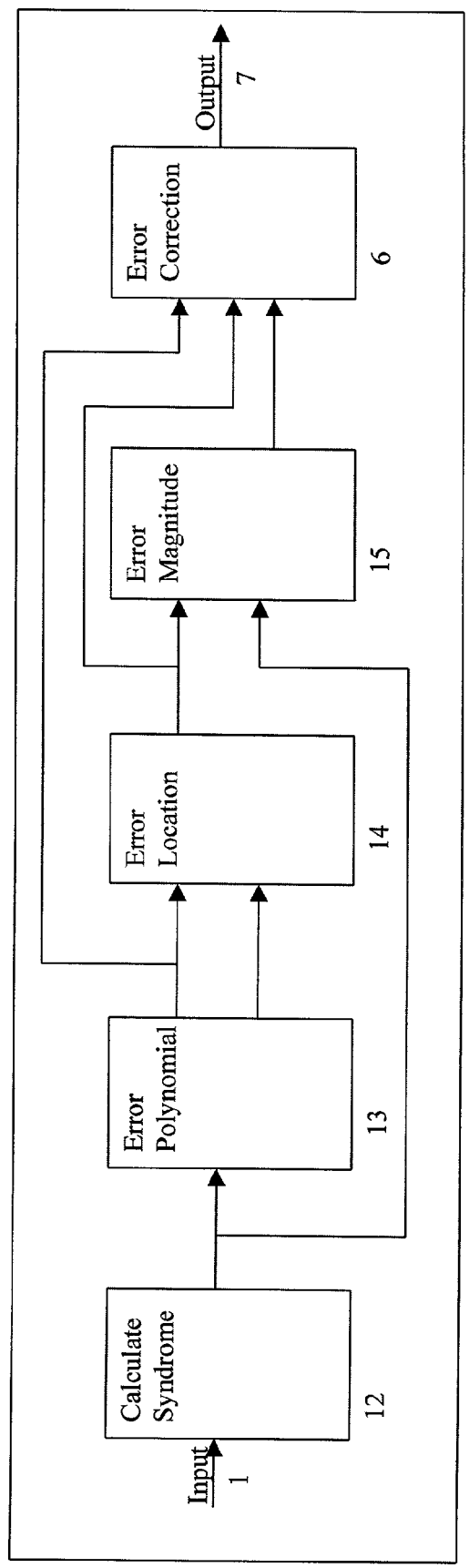
FIG. 6 is a block diagram of a syndrome-based RS Decoder according to an embodiment of the invention.

Referring to FIG. 6, there are two categories of RS decoding algorithms upon which most of the previous works on hard-decision RS decoders are centered: syndrome-based decoding and remainder-based decoding. The embodiments of this invention are discussed for syndrome-based decoding, although the inventive concepts can be used with remainder-based decoding.

The decoding process of a syndrome-based decoder can be divided into four steps as follows:

1. Calculate the syndrome 12;
2. Calculate the coefficients of the error locator polynomial 13;
3. Search the roots of the error locator polynomial 14;
4. Evaluate the magnitude of the errors in the received code word 15, and then correct the errors 6. This step may be performed as one step or as two separate steps.

The syndrome calculation 12 is essentially a frequency-domain analysis of the received code word through a Galois Field Fourier transform. A non-corrupted received code word should contain R consecutive zeros as its roots, where R=2t is the number of parity symbols. Any non-zero values of syndromes indicate that errors exist in the received code word.

Syndrome calculation is similar to parity calculation. Each RS code word has 2t syndrome symbols that depend only on errors and not on the transmitted data part of the RS code word. The syndromes are calculated by substituting the 2t roots of the generator polynomial, g(x), into the received code word, r(x). The received code word is a concatenation of the original (transmitted) code word, c(x), plus errors, e(x): r(x)=c(x)+e(x).

Figure 7:
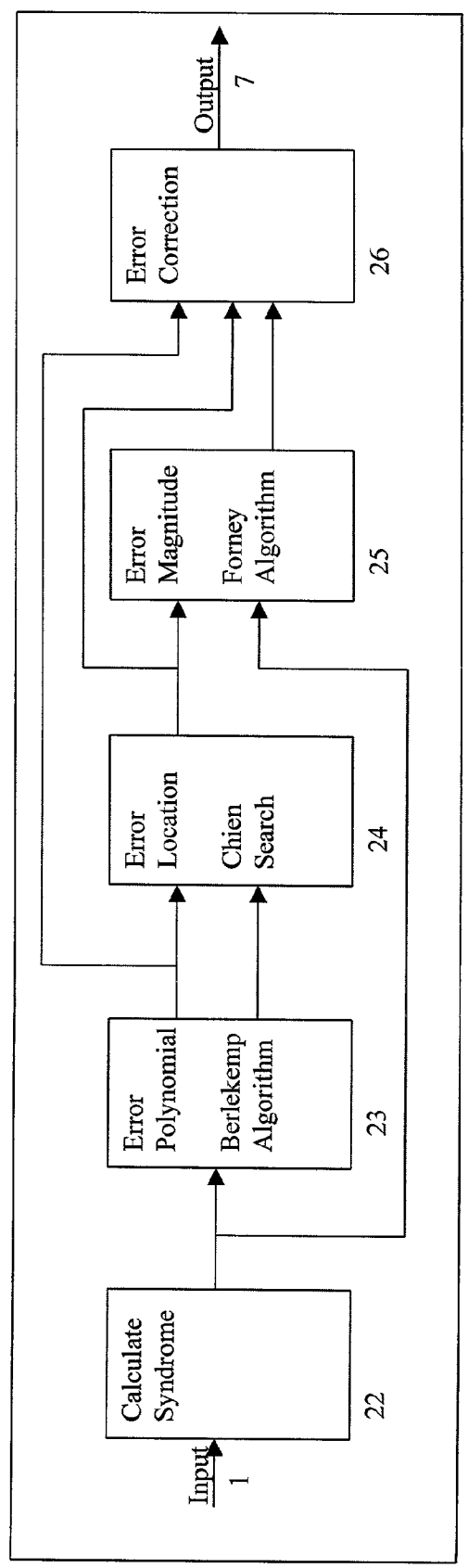
FIG. 7 is a block diagram of the syndrome-based RS Decoder of FIG. 6 implementing specific algorithms according to an embodiment of the invention.

Referring to FIG. 7, the decoding process of a syndrome-based RS decoder according to an embodiment of the invention can be divided into the following four steps:

1. Calculate the syndrome 22 as described above;
2. Calculate the coefficients of the error locator polynomial with a Berlekamp-Massey algorithm 23;
3. Perform a Chien Search 24 of the roots of the error locator polynomial;
4. Evaluate the magnitude of the errors with a Forney Algorithm 25 in the received code word, and then correct the errors 26.

Different algorithms are chosen for each steps 2–4 so that each step can be broken down into the same number of sub-steps as there blocks in a code word. Each of these steps will now be described in more detail.

The basic problem in the calculation of an error locator polynomial is to find the solution for (n–k) nonlinear equations. A Berlekamp-Massey algorithm 23 can be used to efficiently achieve this purpose, especially when correcting a large number of errors. This algorithm determines the error locator polynomial, and the zeroes of this polynomial give the inverse of the error positions. A detailed discussion of the algorithm can be found on line at the electrical engineering department of UCLA, http://www.ee.ucla.edu/~matache/rsc/node8.html.

A Euclidean algorithm could also be used to obtain error locator and error evaluator polynomials. But unlike the Euclidean algorithm, the Berlekamp-Massey algorithm doesn't involve polynomial multiplication and division, and thus is easier to process than the Euclidean algorithm.

After the error locator polynomial is calculated, the roots of the error locator polynomial are computed to find the correct locations of errors. A Chien Search, 24, is performed to achieve this purpose. This method is actually a trial-and-error solution in which all possible roots of the error locator polynomial are checked. Since the number of elements in Galois field is finite, this method is feasible.

A straightforward method to find the error magnitude is not efficient because of the extensive computation required for the matrix inversion. Therefore, this embodiment uses a more efficient method, the Forney algorithm, 25, to evaluate the error magnitude.

Flat-Load Software RS Decoder

The flat-load software RS decoder is an embodiment of the present invention, which evenly distributes the computation load of the decoding process to each computational block of an RS decoder.

Referring again to FIG. 7, in this embodiment, the algorithms are first designed such that each step can be split into several small tasks with identical or similar computation times, and then the data dependency between the adjacent steps is removed allowing vector pipelining or parallel processing. Therefore, the peak-load occurring in the blocks containing the last symbol of an RS code word is removed, and the computation load of the entire decoding process is evenly distributed to all blocks.

Split the Syndrome Calculation

For an (n, k) RS code, the R syndromes can be calculated with the received polynomial r(x) associated with the received code word;

$$S_j = r(\alpha_j) = \sum_{i=0}^{n-1} r_i \alpha_j^i, \alpha_j = \alpha^{z+j}, \text{ for } j = 0, 1, 2, \ldots, R-1, \quad (1)$$

where R=2t is the number of the parity symbols, α is a root, R=n–k is satisfied, and z is an arbitrary integer.

Assume a complete RS code word contains m complete blocks (obviously m should divide n, that is, when n is divided by m, the remainder is 0). Then a partial syndrome can be calculated for each j in each block:

$$S_{j,k} = \sum_{i=0}^{D-1} r_{k*D+i} \alpha_j^{k*D+i}, j = 0, 1, 2, \ldots, R-1, k = 0, \ldots m-1, \quad (2)$$

where $$D = \frac{n}{m}$$

is the length of each block. After the computation of the last partial syndrome has been finished, the overall syndrome can be obtained by simply adding m partial syndromes together:

$$S_j = \sum_{k=0}^{m-1} S_{j,k}, \text{ for } j = 0, 1, 2, \ldots, R-1. \quad (3)$$

Using this technique, the syndrome computation of an RS code word is divided into m independent smaller tasks, which can be performed either serially or in parallel to satisfy different system requirements. The data dependency among the m blocks is completely removed because the summations are independent of each other, that is, the summation of k, for any k, doesn't depend on the summation for any other value of k. The results of each summation are stored until all partial syndrome calculations are complete. Therefore, the total computation load can be evenly distributed over m computational blocks.

Split the Error Locator Polynomial Calculation

In the software implementation of an RS decoder, it is convenient if m blocks can evenly share the redundancy introduced by the RS code. This requires that m divide R=2t, that is, R divided by m is 0 such that, the number of parity symbols R is an integer multiple of the number of blocks m in a code word. Since the Berlekamp-Massey algorithm 23 processes one syndrome value in each recursive step, its complexity is in a linear proportion with parameter R. When m divides R, the computation load of the Berlekamp-Massey algorithm can be easily split into m blocks. R/m syndromes are then processed in each block. If R=16 as in the example noted earlier, then m can be 1, 2, 4, 8, or 16.

Split the Roots Calculation for the Error Locator Polynomial

The error locator polynomial $\Lambda(x)$ is evaluated at n possible roots $x=\alpha^{-i}$, where $0 \leq i \leq n-1$:

$$\Lambda(\alpha^{-i}) = \sum_{j=0}^{R/2} \Lambda_j \alpha^{-ij} \quad (4)$$

Since m divides n, in each of m blocks contained in an RS code word, n/m possible roots can be evaluated. In this way the roots calculation of the error locator polynomial is also divided into m equally loaded tasks.

Split the Error Magnitude Evaluation

In order to calculate the magnitude of each error, an error evaluator polynomial is computed first, and then the error magnitudes are evaluated through the error evaluator polynomial. The error evaluator polynomial is calculated according to the following equation:

$$\Omega(x) = \{[1 + S(x)]\Lambda(x)\} \bmod x^R = S'(x)\Lambda(x) \bmod x^R \quad (5)$$
$$= [S'_0 \Lambda(x)] \bmod x^R + [S'_1 \Lambda(x)x] \bmod x^R + \ldots +$$
$$[S'_{R-1} \Lambda(x) x^{R-1}] \bmod x^R$$

Since there are R items on the right side of the equation, if we calculate R/m items in each block, the calculation of error evaluator polynomial is also evenly divided into m blocks.

The Peak-Load Issue Resolution

In the present software implementation of the RS decoder of FIG. 7, a block processing technique is used to efficiently reduce the real-time sensitivity of the system and the context switching overheads. This invention breaks each step of the decoding process into m tasks of equal size and then uses pipelining or parallel processing techniques to force the load to be constant at all times.

(1) The syndrome calculation has been divided into m small tasks which are denoted as syn(0), syn(I), . . . , syn(m−1) respectively.

(2) The error locator polynomial calculation has been divided into m small tasks, which are denoted as loc(0), loc(I), . . . , loc(m−I) respectively.

(3) The root search has been divided into m small tasks which are denoted as root(0), root(1), . . . , root(m−1) respectively.

(4) The error magnitude evaluation has been divided into m small tasks which are denoted as mag(0), mag(1), . . . , mag(m−I) respectively.

Figure 8:
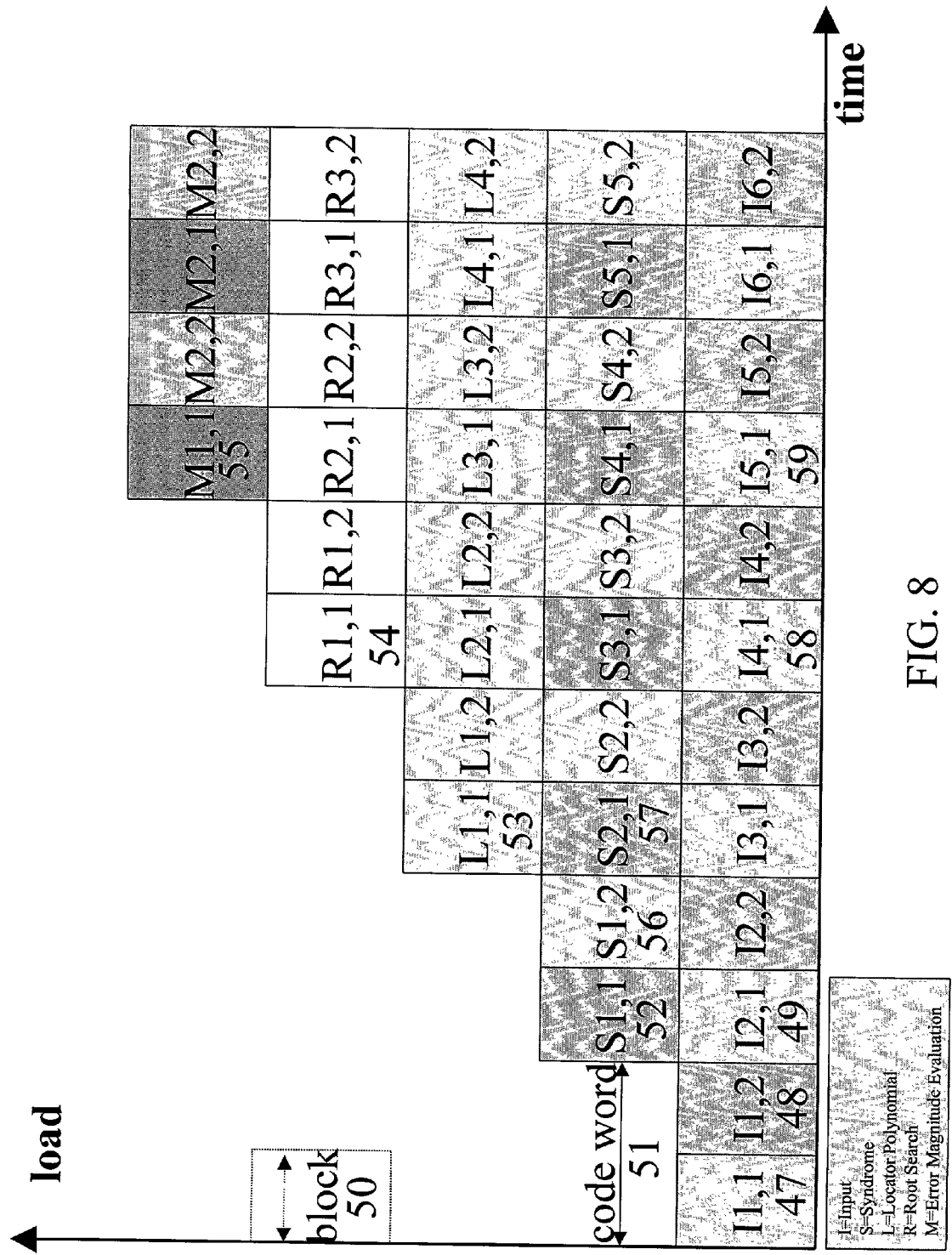
FIG. 8 is a chart showing an evenly distributed software-RS-decoding load according to an embodiment of the invention.

Referring to FIG. 8, to remove the data dependency between the steps, a pipeline or parallel processing mechanism can be used. Here, m=2, which means there are two blocks 50 per code word 51. Again, first letter abbreviations are used for functions. Input is 'I', syndrome is 'S', locator polynomial is 'L', root search is 'R', and error magnitude evaluation is 'M'.

No processing can be done during the first two cycles, 47 and 48 while the first code word 51 is being read in. During the third cycle, as the pipeline is being filled, the first half of a code word I2,1 49 is read in and the first of two syndrome tasks S1,1 52 is performed. During the fourth block cycle 56 as the pipeline is being further filled, the second half of a code word I2,2 is read in and the second of two syndrome tasks S1,2 is performed.

During the fifth block cycle the pipeline is being still further filled, the first half of a further code word I3,1 is read in and the first of two syndrome tasks S2,1 57 of the second code word as well as the first of two locator polynomial tasks L1,1 53 of the first code word are calculated. During the following sixth block cycle the load is the same as the second half of the third code word I3,2 is read in while the second of two syndrome tasks S2,2 as well as the second of two locator polynomial tasks L1,2 are calculated.

Three parallel tasks and a read are being performed in the seventh block cycle 58. The first root search R1,1 54 is one of these tasks. These tasks are completed in the eighth block cycle and the load in the eighth block cycle is the same as in the seventh block cycle.

It can be seen that, after the pipeline has been filled, the computation load in each block cycle is identical. Starting from the ninth block cycle 59, all four tasks, syndrome calculation S4,1 error locator polynomial calculation L3,1 root searching R2,1 and error magnitude evaluation M1,1 55, are performed as well as a read I5,1. There is no peak-load in the decoding process and the load remains constant as long as the pipeline is fed new data.

It is to be understood that even though various embodiments and advantages of the present invention have been set forth in the foregoing description, the above disclosure is illustrative only, and changes may be made in detail, and yet remain within the broad principles of the invention. Therefore, the present invention is to be limited only by the appended claims.

I claim:

1. A computing system for decoding a Reed-Solomon-encoded string of data, the computing system comprising a processor circuit operable to:
   store a portion of a first Reed-Solomon code word, the portion being less than the entire first code word;
   store a portion of a second Reed-Solomon code word, the portion being less than the entire second code word; and
   while storing the portion of the second code word, decoding the portion of the first code word and no other portion of the first code word.

2. The computing system of claim 1 wherein:
   storing the portions of the first and second Reed-Solomon code words comprises storing each of the portions in a respective time having a duration t; and
   decoding the portion of the first code word comprises decoding the portion in the duration t.

3. A computing system for decoding a Reed-Solomon-encoded string of data, the computing system comprising a processor circuit operable to:
   receive m portions of a first Reed-Solomon code word, m being greater than one;
   receive m portions of a second Reed-Solomon code word after receiving the first code word;
   while receiving a first portion of the second code word, decoding a first portion of the first code word and no other portion of the first code word; and
   while receiving a second portion of the second code word, decoding the second portion of the first code word and no other portion of the first code word.

4. The computing system of claim 3 wherein the processor circuit is further operable to:
   receiving the first and second portions of the second code word during respective first and second time periods each having a same duration; and
   decode the first and second portions of the first code word during the first and second time periods respectively.

5. The computing system of claim 3 wherein the processor circuit is further operable to:
   receive m portions of a third Reed-Solomon code word;
   while receiving a first portion of the third code word, decoding a first portion of the second code word and no other portion of the second code word; and
   while receiving a second portion of the third code word, decoding the second portion of the second code word and no other portion of the second code word.

6. The computing system of claim 3 wherein:
   the first and second Reed-Solomon code words each comprise n symbols; and
   n/m equals an integer that is greater than one.

7. A computing system for decoding a Reed-Solomon-encoded string of data, the computing system comprising a processor circuit operable to:
   receive m portions of each of five Reed-Solomon code words during respective time periods each having a duration, each code word comprising n symbols such that n/m equals an integer that is greater than one;
   while receiving a first portion of the second code word, decoding a first portion of the first code word according to a first algorithm and decoding no other portion of the first code word;
   while receiving a first portion of the third code word, decoding a first portion of the second code word according to the first algorithm, decoding the first portion of the first code word according to a second algorithm, and decoding no other portions of the first and second code words;
   while receiving a first portion of the fourth code word, decoding a first portion of the third code word according to the first algorithm, decoding the first portion of the second code word according to the second algorithm, decoding the first portion of the first code word according to a third algorithm, and decoding no other portions of the first, second, and third code words; and
   while receiving a first portion of the fifth code word, decoding a first portion of the fourth code word according to the first algorithm, decoding the first portion of the third code word according to the second algorithm, decoding the first portion of the second code word according to the third algorithm, decoding the first portion of the first code word according to a fourth algorithm, and decoding no other portions of the first, second, third, and fourth code words.

8. A method of operating a computing system with a Reed-Solomon decoding application comprising the steps of:
   receiving a portion of a first Reed-Solomon code word, the portion being less than the whole first code word;
   receiving a portion of a second Reed-Solomon code word, the portion being less than the whole second code word; and
   while receiving the portion of the second code word, decoding the portion of the first code word and no other portion of the first code word.

9. The method of claim 8 wherein the portion of the first Reed-Solomon code word is the same length as the portion of the second Reed-Solomon code word.

10. The method of claim 8 wherein:
    receiving the portion of the second code word comprises receiving the portion of the second code word in a time T; and
    decoding the portion of the first code word comprises decoding the portion of the first code word in the time T.

11. The method of claim 8 wherein:
    the first and second code words each comprises m portions of equal-length.

12. A method of operating a computing system with a Reed-Solomon decoding application comprising the steps of:
    receiving m portions of a first Reed-Solomon code word, m being greater than one;
    receiving m portions of a second Reed-Solomon code word after receiving the first code word; and
    while receiving a first portion of the second code word, decoding a first portion of the first code word and no other portion of the first code word; and
    while receiving a second portion of the second code word, decoding the second portion of the first code word and no other portion of the first code word.

13. The method of claim 12 wherein:
    receiving the m portions of the first and second code words comprises receiving each of the m portions during a respective period of time T; and
    decoding each of the first and second portions of the first code word during the same respective periods that the first and second portions of the second code word are received.

14. The method of claim 12 wherein:
the first and second code words each comprise n equal-length symbols; and
n/m equals an integer greater than one.

15. A method of operating a computing system with a Reed-Solomon decoding application comprising the steps of:
receiving m portions of each of five Reed-Solomon code words during respective time periods each having a duration, each code word comprising n symbols such that n/m equals an integer that is greater than one;
while receiving a first portion of the second code word, decoding a first portion of the first code word according to a first algorithm and decoding no other portion of the first code word;
while receiving a first portion of the third code word, decoding a first portion of the second code word according to the first algorithm, decoding the first portion of the first code word according to a second algorithm, and decoding no other portions of the first and second code words;
while receiving a first portion of the fourth code word, decoding a first portion of the third code word according to the first algorithm, decoding the first portion of the second code word according to the second algorithm, decoding the first portion of the first code word according to a third algorithm, and decoding no other portions of the first, second, and third code words; and
while receiving a first portion of the fifth code word, decoding a first portion of the fourth code word according to the first algorithm, decoding the first portion of the third code word according to the second algorithm, decoding the first portion of the second code word according to the third algorithm, decoding the first portion of the first code word according to a fourth algorithm, and decoding no other portions of the first, second, third, and fourth code words.

16. The method of claim 15 wherein the portions of the five Reed-Solomon code words each have a same size.

* * * * *